(12) United States Patent
Bellynck et al.

(10) Patent No.: US 11,923,487 B2
(45) Date of Patent: Mar. 5, 2024

(54) METHOD FOR PRODUCING AN OPTOELECTRONIC DEVICE

(71) Applicant: OSRAM Opto Semiconductors GmbH, Regensburg (DE)

(72) Inventors: Gregory Bellynck, Nittendorf (DE); Ivar Tangring, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 471 days.

(21) Appl. No.: 17/296,378

(22) PCT Filed: Dec. 3, 2019

(86) PCT No.: PCT/EP2019/083406
§ 371 (c)(1),
(2) Date: May 24, 2021

(87) PCT Pub. No.: WO2020/115010
PCT Pub. Date: Jun. 11, 2020

(65) Prior Publication Data
US 2022/0020902 A1    Jan. 20, 2022

(30) Foreign Application Priority Data
Dec. 7, 2018   (DE) .................. 102018131296.2

(51) Int. Cl.
*H01L 33/56* (2010.01)
*H01L 33/60* (2010.01)
*H01L 33/50* (2010.01)

(52) U.S. Cl.
CPC .............. *H01L 33/56* (2013.01); *H01L 33/60* (2013.01); *H01L 33/507* (2013.01);
(Continued)

(58) Field of Classification Search
CPC ....... H01L 33/56; H01L 33/60; H01L 33/507; H01L 2933/0041; H01L 2933/005;
(Continued)

(56) References Cited

U.S. PATENT DOCUMENTS

| 10,763,245 B2 | 9/2020 | Haiberger et al. |
| 2008/0218072 A1 | 9/2008 | Haruna et al. |

(Continued)

FOREIGN PATENT DOCUMENTS

| DE | 102016105868 A1 | 10/2017 |
| DE | 102016119002 A1 | 4/2018 |
| EP | 2362713 A2 | 8/2011 |

*Primary Examiner* — Mohammad A Rahman
(74) *Attorney, Agent, or Firm* — Slater Matsil, LLP

(57) ABSTRACT

In an embodiment a method includes providing a carrier with an optoelectronic semiconductor chip-component arranged on a top side of the carrier, arranging a first potting material on the top side of the carrier, arranging a second potting material on the first potting material, wherein the second potting material comprises a higher density than the first potting material, wherein a top side of the optoelectronic semiconductor chip-component is covered by neither the first potting material nor the second potting material and allowing a force to act on the first potting material and the second potting material such that the second potting material migrates in a direction toward the top side of the carrier.

18 Claims, 5 Drawing Sheets

(52) U.S. Cl.
CPC .......... *H01L 2933/005* (2013.01); *H01L 2933/0041* (2013.01); *H01L 2933/0058* (2013.01)

(58) Field of Classification Search
CPC . H01L 2933/0058; H01L 33/50; H01L 33/52; H01L 23/28–3192; H01L 21/56–568; H01L 2924/181–186
See application file for complete search history.

(56) References Cited

U.S. PATENT DOCUMENTS

| | | | |
|---|---|---|---|
| 2011/0204400 A1* | 8/2011 | Koizumi | H05B 33/10 257/E33.056 |
| 2012/0112623 A1 | 5/2012 | Kobashi | |
| 2016/0097497 A1 | 4/2016 | Benner et al. | |

* cited by examiner

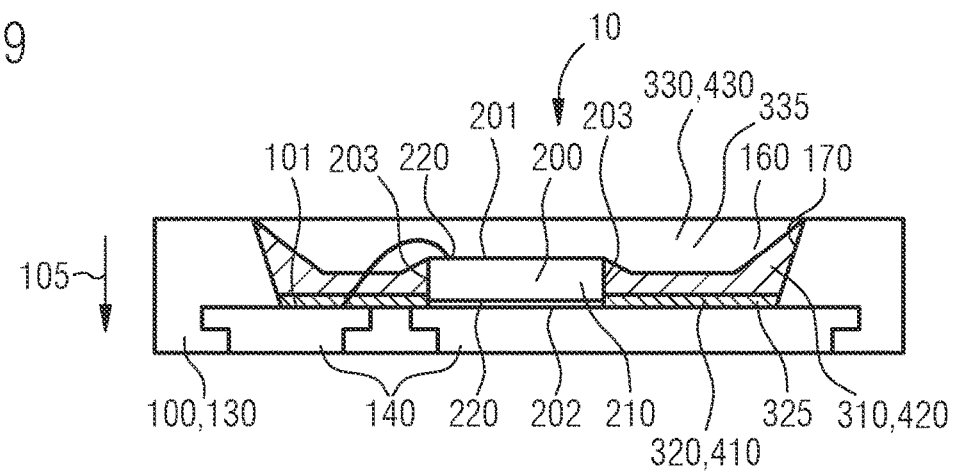
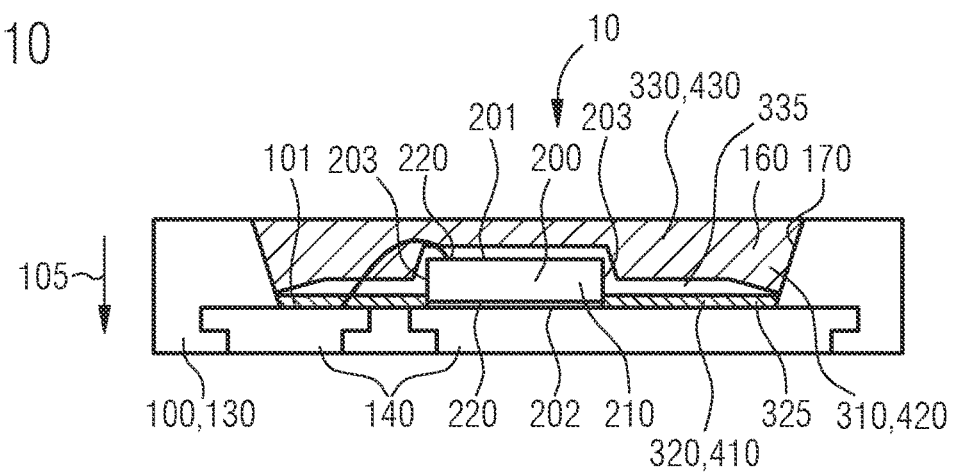
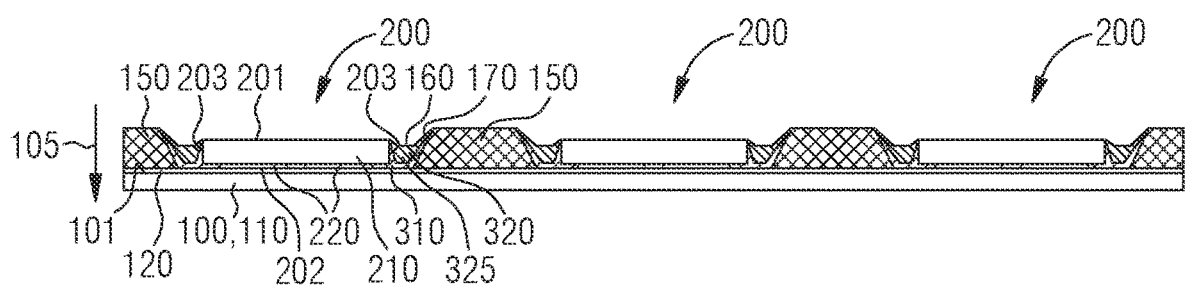

METHOD FOR PRODUCING AN
OPTOELECTRONIC DEVICE

This patent application is a national phase filing under section 371 of PCT/EP2019/083406, filed Dec. 3, 2019, which claims the priority of German patent application 10 2018 131296.2, filed Dec. 7, 2018, each of which is incorporated herein by reference in its entirety.

TECHNICAL FIELD

The present invention relates to a method for producing an optoelectronic device.

BACKGROUND

Optoelectronic devices in which an optoelectronic semiconductor chip is arranged at a top side of a carrier and is embedded into a potting material are known from the prior art.

SUMMARY

Embodiments provide a method for producing an optoelectronic device. A method for producing an optoelectronic device comprises steps for providing a carrier with an optoelectronic semiconductor chip-component arranged over a top side of the carrier, for arranging a first potting material over the top side of the carrier, for arranging a second potting material over the first potting material, wherein the second potting material comprises a higher density than the first potting material, and for allowing a force to act on the first potting material and the second potting material in such a way that the second potting material migrates in a direction toward the top side of the carrier.

This method advantageously makes it possible for the second potting material in the optoelectronic device obtainable by the method to be arranged near the top side of the carrier, even though the second potting material is only applied after the first potting material. Applying the second potting material only after applying the first potting material may advantageously prevent the second potting material from wetting regions of the carrier or of the optoelectronic semiconductor chip-component at which wetting by the second potting material is undesirable. A further advantage of the method is that during the migration of the second potting material in a direction toward the top side of the carrier while allowing the force to act, particles possibly embedded into the second potting material are entrained with the second potting material and thereby likewise migrate in a direction toward the top side of the carrier.

In one embodiment of the method, allowing the force to act is effected by centrifuging the carrier. Advantageously, as a result a force of adjustable magnitude directed in a direction toward the top side of the carrier may be exerted on the first potting material and the second potting material.

In one embodiment of the method, the first potting material is arranged over the top side of the carrier in such a way that a side face of the optoelectronic semiconductor chip-component is wetted by the first potting material. Advantageously, the wetting of the side face of the optoelectronic semiconductor chip-component by the first potting material may prevent or at least limit a wetting of the side face of the optoelectronic semiconductor chip-component by the second potting material.

In one embodiment of the method, arranging the second potting material is affected before the first potting material has cured. This advantageously makes it possible for the second potting material to migrate through the first potting material in a direction toward the top side of the carrier during the process of centrifuging the carrier.

In one embodiment of the method, the centrifuging is carried out in such a way that a first layer comprising the second potting material forms over the top side of the carrier, and a second layer comprising the first potting material forms over the first layer. Advantageously, the method thereby makes it possible, in the optoelectronic device obtainable by the method, to form the first layer comprising the second potting material below the second layer comprising the first potting material, even though the second potting material is only applied after the first potting material.

In one embodiment of the method, the latter comprises a further step for arranging a wavelength-converting material over the second layer. The wavelength-converting material may be configured to convert electromagnetic radiation emitted by the optoelectronic semiconductor chip-component at least partly into electromagnetic radiation of a different wavelength.

In one embodiment of the method, arranging the wavelength-converting material is affected before the second layer has cured. This advantageously makes it possible for the wavelength-converting material and/or wavelength-converting particles contained in the wavelength-converting material to sink at least partly into the second layer.

In one embodiment of the method, arranging the wavelength-converting material is affected after the second layer has cured. This advantageously prevents the wavelength-converting material and/or wavelength-converting particles contained in the wavelength-converting material from sinking into the second layer. This ensures that the wavelength-converting material in the optoelectronic device obtainable by the method remains above the second layer.

In one embodiment of the method, the wavelength-converting material comprises a silicone and wavelength-converting particles embedded into the silicone. The wavelength-converting particles may be configured to convert electromagnetic radiation emitted by the optoelectronic semiconductor chip-component of the optoelectronic device obtainable by the method at least partly into electromagnetic radiation of a different wavelength.

In one embodiment of the method, the first potting material comprises a silicone. In this case, for example, the first potting material constituting the second layer and the wavelength-converting material arranged over the second layer may comprise the same matrix material. This may make it possible, for example, for wavelength-converting particles contained in the wavelength-converting material to migrate from the wavelength-converting material into the first potting material of the second layer.

In one embodiment of the method, after the centrifuging, a further step is carried out for removing at least one part of the first potting material. Advantageously, substantially only the second potting material then remains in the optoelectronic device obtainable by the method.

In one embodiment of the method, the first potting material comprises a solvent. In this case, the solvent is removed by evaporation. This advantageously constitutes a simple possibility for removing at least one part of the first potting material after the centrifuging.

Another possibility is to wash away at least one part of the first potting material after the centrifuging. In this case, the first potting material may comprise a silicone oil, for example.

In one embodiment of the method, the second potting material comprises a silicone. In this case, the second potting material may comprise for example the same matrix material as the first potting material.

In one embodiment of the method, the second potting material comprises embedded particles. Advantageously, in this method the embedded particles are entrained in the second potting material during the process of centrifuging the carrier and thereby migrate with the second potting material in a direction toward the top side of the carrier. As a result, in this method the particles embedded into the second potting material may advantageously be moved in a direction toward the top side of the carrier even if the embedded particles are so small, for example, that sedimentation of the embedded particles is not possible.

In one embodiment of the method, the second potting material comprises between 30 percent by weight and 50 percent by weight of embedded $TiO_2$ particles comprising an average diameter of between too nm and 300 nm. Advantageously, potting material comprising embedded particles of this type are well suited to the production of optically reflective layers.

In one embodiment of the method, the first potting material comprises a density of between 1 $g/cm^3$ and 1.3 $g/cm^3$. In this case, the second potting material comprises a density of between 1.4 $g/cm^3$ and 2.2 $g/cm^3$. Advantageously, the second potting material thereby comprises a higher density than the first potting material. This makes it possible for the second potting material to migrate in a direction toward the top side of the carrier during the process of centrifuging the carrier.

In one embodiment of the method, the optoelectronic semiconductor chip-component comprises an optoelectronic semiconductor chip. The optoelectronic semiconductor chip may be a light emitting diode chip (LED chip), for example.

In one embodiment of the method, after the centrifuging, a further step is carried out for removing the carrier. As a result, the method advantageously makes it possible to produce a chip scale optoelectronic device which, apart from the potting material, comprises no carrying components and has very small external dimensions.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings. Here in each case in a schematic illustration:

FIG. 9 shows a sectional side view of the arrangement after applying a wavelength-converting material;

FIG. 10 shows a sectional side view of the arrangement after sinking of wavelength-converting particles;

FIG. 11 shows a sectional side view of a further arrangement comprising a carrier, optoelectronic semiconductor chip-components arranged over a top side of the carrier, a first potting material arranged over the top side of the carrier and a second potting material arranged over the first potting material;

DETAILED DESCRIPTION OF ILLUSTRATIVE EMBODIMENTS

Figure 1:
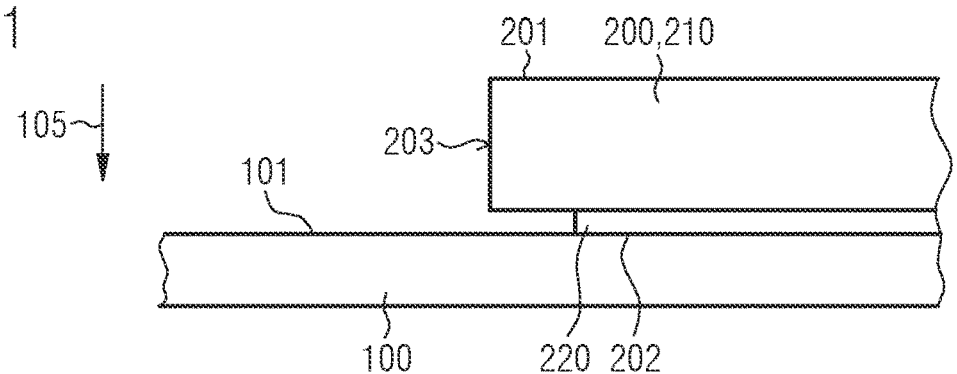
FIG. 1 shows a sectional side view of an optoelectronic semiconductor chip-component arranged over a top side of a carrier.

FIG. 1 shows a schematic sectional side view of a carrier 100 comprising a top side 101. The carrier 100 may also be referred to as substrate. The carrier 100 may be formed for example as a ceramic or metallic carrier or as a circuit board. The carrier 100 may also be part of a plastic package.

An optoelectronic semiconductor chip-component 200 has been arranged at the top side 101 of the carrier 100. The optoelectronic semiconductor chip-component 200 comprises a top side 201 and an underside 202 opposite the top side 201. Side faces 203 of the optoelectronic semiconductor chip-component 200 extend between the top side 201 and the underside 202. The optoelectronic semiconductor chip-component 200 is arranged at the top side 101 of the carrier 100 in such a way that the underside 202 of the optoelectronic semiconductor chip-component 200 faces the top side 101 of the carrier 100.

In the example shown in FIG. 1, the optoelectronic semiconductor chip-component 200 comprises only one optoelectronic semiconductor chip 210. In other variants, the optoelectronic semiconductor chip-component 200 may comprise further components, for example a wavelength-converting element, besides the optoelectronic semiconductor chip 210. The optoelectronic semiconductor chip 210 comprises at least one electrical contact pad 220 oriented toward the underside 202 of the optoelectronic semiconductor chip-component 200. The electrical contact pad 220 may be secured to the top side 101 of the carrier 100 for example by means of a solder connection or an electrically conductive adhesive connection. The optoelectronic semiconductor chip 210 may also comprise a plurality of electrical contact pads 220.

The optoelectronic semiconductor chip 210 may be formed as a light emitting semiconductor chip, for example as a light emitting diode chip (LED chip). In the example shown in FIG. 1, the optoelectronic semiconductor chip 210 may be formed as a volume emitting semiconductor chip, for example. In this case, during operation, the optoelectronic semiconductor chip 210 emits electromagnetic radiation, for example visible light, at the top side 201 and at the side faces 203 of the optoelectronic semiconductor chip-component 200. The optoelectronic semiconductor chip 210 may be formed as a sapphire flip-chip, for example.

Figure 2:
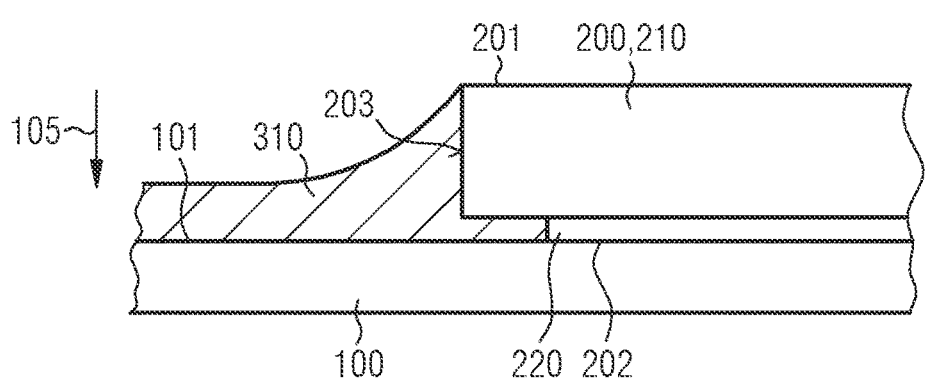
FIG. 2 shows the carrier and the optoelectronic semiconductor chip-component after arranging a first potting material over the top side of the carrier.

FIG. 2 shows the arrangement from FIG. 1 in a schematic illustration in a processing state temporally succeeding the illustration in FIG. 1.

A first potting material 310 has been arranged over the top side 101 of the carrier too. The first potting material 310 has been arranged next to the optoelectronic semiconductor chip-component 200 and covers at least one part of that part of the top side 101 of the carrier too which is not covered by the optoelectronic semiconductor chip-component 200. The first potting material 310 may have been applied by means of a metering method (dispensing), for example.

The first potting material 310 arranged over the top side 101 of the carrier 100 wets not only the top side 101 of the carrier 100 but also at least one portion of the side faces 203 of the optoelectronic semiconductor chip-component 200. Wetting the side faces 203 of the optoelectronic semiconductor chip-component 200 may have been effected for example by the first potting material 310 having crept up the side faces 203 of the optoelectronic semiconductor chip-component 200 after the process of arranging the first potting material 310 at the top side 101 of the carrier 100. In this way, the first potting material 310 may wet the side faces 203 of the optoelectronic semiconductor chip-component 200 even if the first potting material 310 does not fill the entire volume in the vicinity of the optoelectronic semiconductor chip-component 200 over the top side 101 of the carrier 100 as far as the top side 201 of the optoelectronic semiconductor chip-component 200. In this case, after the arranging over the top side 101 of the carrier 100, the first potting material 310 does not constitute a flat layer, but rather comprises a concave surface.

The first potting material 310 may comprise a silicone, for example. It is expedient if the first potting material 310 comprises a clear silicone that is largely transparent to electromagnetic radiation emitted by the optoelectronic semiconductor chip 210 of the optoelectronic semiconductor chip-component 200. The first potting material 310 may also comprise an epoxy. Alternatively, the first potting material 310 may also comprise for example a clear silicone mixed with a solvent, a silicone oil or just a solvent. DI water, for example, is suitable as solvent.

Figure 3:
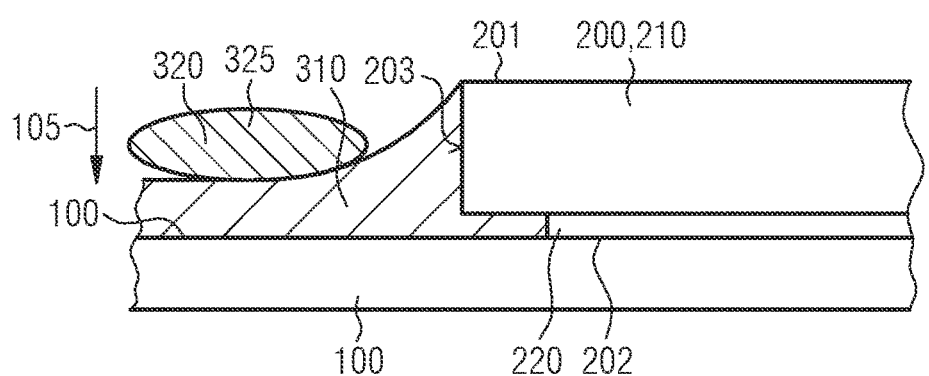
FIG. 3 shows the carrier and the optoelectronic semiconductor chip-component after arranging a second potting material over the first potting material.

FIG. 3 shows the arrangement from FIG. 2 in a processing state temporally succeeding the illustration in FIG. 2.

A second potting material 320 has been arranged over the first potting material 310. Arranging the second potting material 320 may also have been effected by means of a metering method (dispensing), for example.

Arranging the second potting material 320 over the first potting material 310 has been affected before the first potting material 310 has cured. The first potting material 310 is thus still flowable in the processing state shown in FIG. 3.

The second potting material 320 comprises a higher density than the first potting material 310. Byway of example, the first potting material 310 may comprise a density of between 1 g/cm$^3$ and 1.3 g/cm$^3$. The second potting material 320 may comprise for example a density of between 1.4 g/cm$^3$ and 2.2 g/cm$^3$. In particular, the first potting material 310 may comprise for example a density of approximately 1.15 g/cm$^3$, while the second potting material 320 may comprise for example a density of approximately 1.6 g/cm$^3$.

The second potting material 320 may comprise a silicone. If the first potting material 310 also comprises a silicone, then the first potting material 310 and the second potting material 320 may comprise the same silicone. The second potting material 320 may also comprise an epoxy, for example the same epoxy as the first potting material 310.

In addition, the second potting material 320 may comprise embedded particles 325 that increase the density of the second potting material 320. By way of example, the second potting material 320 may comprise embedded light-reflecting particles 325 that impart a white color to the second potting material 320. By way of example, TiO$_2$ particles are suitable as light-reflecting particles 325. Said TiO$_2$ particles may comprise for example an average diameter of between too nm and 300 nm. In particular, the TiO$_2$ particles may comprise for example an average diameter of approximately 200 nm. The second potting material 320 may comprise for example a proportion of between 30 percent by weight and 50 percent by weight, in particular for example a proportion of 40 percent by weight of such TiO$_2$ particles 325. In this case, the second potting material 320 may comprise for example a density of approximately 1.6 g/cm$^3$.

Alternatively, the second potting material 320 may also comprise light-absorbing particles 325 or other embedded particles or fillers.

Figure 4:
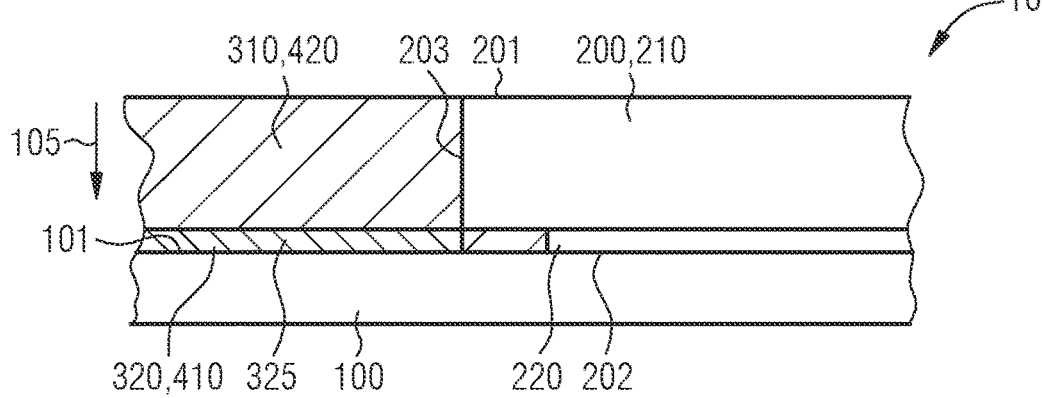
FIG. 4 shows the carrier with the optoelectronic semiconductor chip-component after centrifuging the carrier.

FIG. 4 shows a schematic view of the arrangement from FIG. 3 in a processing state temporally succeeding the illustration in FIG. 3.

The carrier 100 has been centrifuged in such a way that a force directed in a direction 105 toward the top side 101 of the carrier 100 has acted on the components arranged over the top side 101 of the carrier 100. Under the influence of this force, the second potting material 320 has migrated in a direction toward the top side 101 of the carrier 100. Since the second potting material 320 comprises a higher density than the first potting material 310, the second potting material 320 has at least partly displaced the first potting material 310 at the top side 101 of the carrier 100. As a result, a first layer 410 comprising the second potting material 320 has formed over the top side 101 of the carrier 100. A second layer 420 comprising the first potting material 310 has formed over the first layer 410. An inversion of the arrangement of the first potting material 310 and the second potting material 320 has thus resulted. The first layer 410 and the second layer 420 are substantially flat layers comprising substantially planar top sides.

If the first potting material 310 and the second potting material 320 comprise a sufficiently large difference in density, it may be possible to dispense with the centrifuging. In this case, the gravitational force acting on the first potting material 310 and the second potting material 320 may already be sufficient to drive the second potting material 320 in a direction toward the top side 101 of the carrier 100.

In the example illustrated, the quantity of the first potting material 310 arranged over the top side 101 of the carrier 100 and the quantity of the second potting material 320 arranged over the first potting material 310 were dimensioned such that the first layer 410 formed from the second potting material 320 comprises a smaller thickness than the second layer 420 formed from the first potting material 310. The quantity of the first potting material 310 and the quantity of the second potting material 320 were additionally dimensioned such that the surface of the second layer 420 facing away from the top side 101 of the carrier 100 terminates substantially flush with the top side 201 of the optoelectronic semiconductor chip-component 200. This is not absolutely necessary, however. The surface of the second layer 420 could also be arranged below the top side 201 of the optoelectronic semiconductor chip-component 200. It is likewise possible for the first potting material 310 to cover the top side 201 of the optoelectronic semiconductor chip-component 200 during the process of forming the second layer 420.

Since the first potting material 310 had already wetted the side faces 203 of the optoelectronic semiconductor chip-component 200 before the process of arranging the second potting material 320, the second potting material 320 was subsequently no longer able to wet the side faces 203 of the optoelectronic semiconductor chip-component 200. As a result, the side faces 203 of the optoelectronic semiconductor chip-component 200 are not covered by the second potting material 320 even after the centrifuging.

The first layer 410 comprising the second potting material 320 constitutes a thin reflective layer at the top side 101 of the carrier 100. Electromagnetic radiation emitted by the optoelectronic semiconductor chip-component 200 in a direction toward the top side 101 of the carrier 100 during operation of the optoelectronic semiconductor chip-component 200 can be reflected at the first layer 410 and utilized as a result. Since the side faces 203 of the optoelectronic semiconductor chip-component 200 are not wetted by the reflective second potting material 320, emission of electromagnetic radiation at the side faces 203 of the optoelectronic semiconductor chip-component 200 is not impeded.

Centrifuging the carrier 100 was carried out before curing the first potting material 310 and the second potting material 320. After centrifuging and forming the first layer 410 comprising the second potting material 320 and the second layer 420 comprising the first potting material 310, further processing steps for curing the first potting material 310 and the second potting material 320 may be effected. The curing may be effected for example by thermal treatment and/or by irradiation with light.

In another variant, it is possible, after centrifuging the carrier 100, to remove at least one part of the first potting material 310 and of the second layer 420 constituted from the first potting material 310. In this case, for example, only the first layer 410 comprising the second potting material 320 may remain at the top side 101 of the carrier 100. Removing the first potting material 310 may be effected for example by evaporating the first potting material 310 or by washing away the first potting material 310. Evaporating the first potting material 310 is possible, for example, if the latter comprises a solvent. Washing away the first potting material 310 is possible, for example, if the latter comprises a silicone oil.

In the processing state shown in FIG. 4, the arrangement illustrated in FIG. 4 constitutes an optoelectronic device 10. The carrier 100 may remain as part of the optoelectronic device 10. However, it is also possible to remove the carrier 100.

A number of variants and extensions of the production method described above with reference to FIGS. 1 to 4 are explained below. Here in each case only the deviations from the method described above are explained below. For the rest, the description above is also applicable to the production methods presented below and to the optoelectronic devices obtainable by the production methods.

Figure 5:
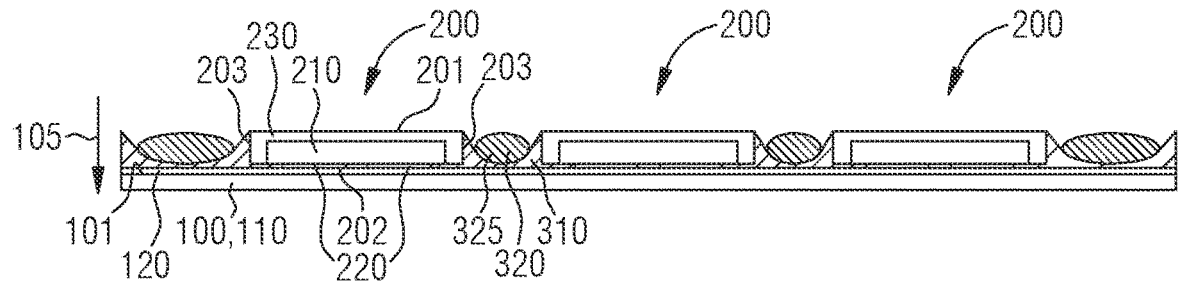
FIG. 5 shows a sectional side view of a carrier with optoelectronic semiconductor chip-components arranged over the top side of said carrier, a first potting material arranged over the top side of the carrier and a second potting material arranged over the first potting material.

FIG. 5 shows a schematic sectional side view of the carrier 100 with a plurality of optoelectronic semiconductor chip-components 200 arranged over the top side 101 of the carrier 100. Between and alongside the optoelectronic semiconductor chip-components 200, the first potting material 310 has been arranged over the top side 101 of the carrier 100. The second potting material 320 has been arranged over the first potting material 310. The processing state shown in FIG. 5 thus corresponds to the processing state shown in FIG. 3.

In contrast to the variant explained with reference to FIGS. 1 to 4, the optoelectronic semiconductor chip-components 200 in the example shown in FIG. 5 each comprise, in addition to the optoelectronic semiconductor chip 210, a converter layer 230 partly embedding the optoelectronic semiconductor chip 210. In the example illustrated, the converter layer 230 covers the top side and the side faces of the optoelectronic semiconductor chips 210. The top sides 201 and the side faces 203 of the optoelectronic semiconductor chip-components 200 are thus constituted by the converter layers 230 of the optoelectronic semiconductor chip-components 200. The optoelectronic semiconductor chip-components 200 thus represent examples of chip scale packages. In each optoelectronic semiconductor chip-component 200, the converter layer 230 is provided for converting electromagnetic radiation emitted by the optoelectronic semiconductor chip 210 at least partly into electromagnetic radiation of a different wavelength.

In the example shown in FIG. 5, the carrier 100 is a temporary carrier 110, which is removed at the end of processing. The optoelectronic semiconductor chip-components 200 are secured to the top side 101 of the carrier 100 by means of an adhesive film 120. The first potting material 310 has been arranged over the adhesive film 120.

Figure 6:
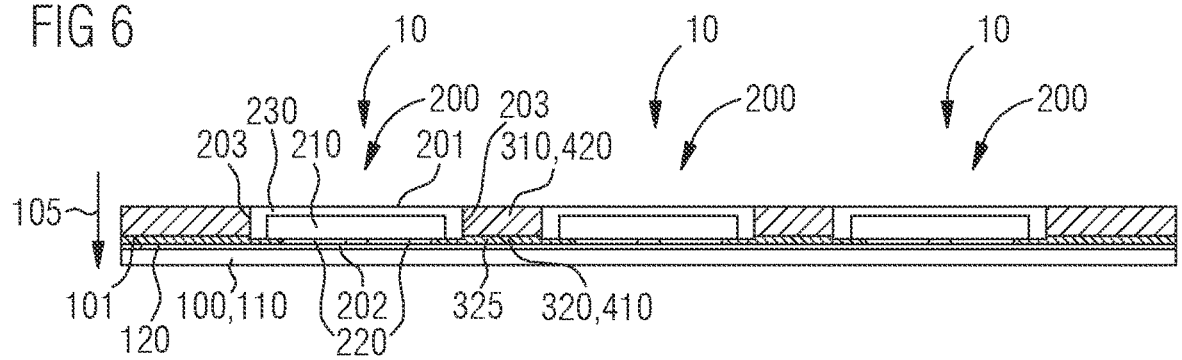
FIG. 6 shows the arrangement of carrier, optoelectronic semiconductor chip-components, first potting material and second potting material after centrifuging the carrier.

FIG. 6 shows a schematic illustration of the arrangement from FIG. 5 in a processing state temporally succeeding FIG. 5.

The carrier 100 has been centrifuged in such a way that the second potting material 320 has migrated in a direction 105 toward the top side 101 of the carrier 100. As a result, once again the first layer 410 comprising the second potting material 320 has formed over the top side 101 of the carrier 100. The second layer 420 comprising the first potting material 310 has formed over the first layer 410.

In a processing step temporally succeeding the illustration in FIG. 6, the temporary carrier 100, 110 and the adhesive film 120 are stripped away. In addition, the body constituted by the layers 410, 420 of the potting material 310, 320 is divided into a plurality of optoelectronic devices 10 such that each optoelectronic device 10 comprises one of the optoelectronic semiconductor chip-components 200. The dividing may be effected before or after stripping away the temporary carrier 110.

Figure 7:
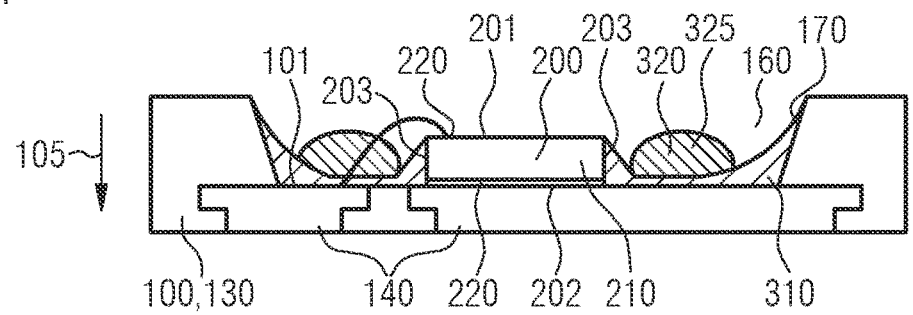
FIG. 7 shows a further arrangement comprising a carrier, an optoelectronic semiconductor chip-component, a first potting material arranged over a top side of the carrier and a second potting material arranged over the first potting material.

A further variant of the production method is described below with reference to FIGS. 7 to 10. FIG. 7 shows a schematic sectional side view of a method state corresponding to the method state shown in FIG. 3.

In the variant shown in FIG. 7, the carrier 100 is constituted by a package body 130 with leadframe sections 140 embedded into the package body 130. The package body 130 may also be referred to as a QFN package. The package body 130 may comprise a plastic material, for example. The package body 130 may be produced by a molding method (mold method), for example. In this case, the leadframe sections 140 may already have been embedded into the package body 130 during the process of forming the package body 130 by means of encapsulating the leadframe sections 140 by molding.

The package body 130 comprises a cavity 160. A bottom region of the cavity 160 constitutes the top side 101 of the carrier 100. At the bottom region of the cavity 160 constituting the top side 101 of the carrier 100, the leadframe sections 140 are partly exposed.

In this example, the optoelectronic semiconductor chip-component 200 comprises only one optoelectronic semiconductor chip 210, formed as a volume emitting sapphire chip. The optoelectronic semiconductor chip-component 200 has been arranged at the top side 101 of the carrier 100 in the cavity 160 of the package body 130. The first potting material 310 has subsequently been arranged over the top side 101 of the carrier 100. The first potting material 310 has at least partly wetted the side faces 203 of the optoelectronic semiconductor chip-component 200. In addition, the first potting material 310 has at least partly wetted a package wall 170 of the package body 130 delimiting the cavity 160. The second potting material 320 has subsequently been arranged over the first potting material 310.

Figure 8:
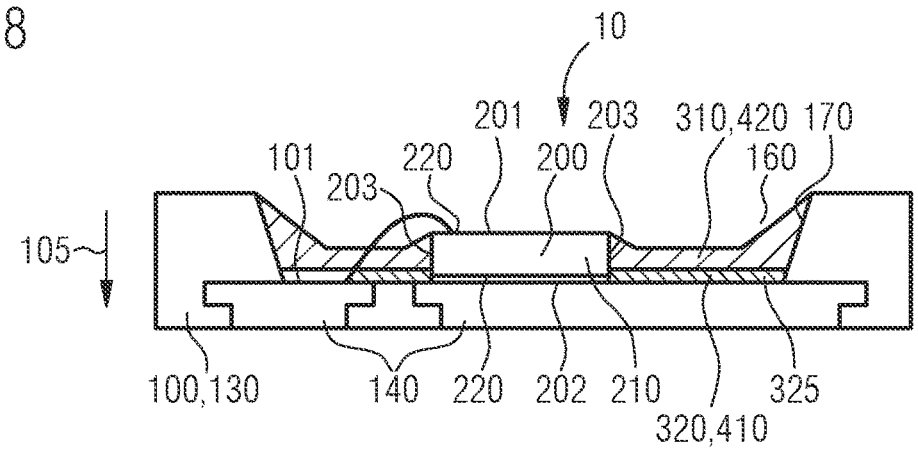
FIG. 8 shows this arrangement after centrifuging the carrier.

FIG. 8 shows the arrangement from FIG. 7 in a temporally succeeding processing state.

The carrier 100 has been centrifuged in such a way that the second potting material 320 has migrated in a direction 105 toward the top side 101 of the carrier 100. As a result, the first layer 410 comprising the second potting material 320 has formed over the top side 101 of the carrier 100. The second layer 420 comprising the first potting material 310 has formed over the first layer 410.

In the example shown, a top side of the second layer 420 facing away from the top side 101 of the carrier 100 is not formed in a plane fashion, but rather in a slightly concave fashion. As a result of the wetting of the side faces 203 of the optoelectronic semiconductor chip-component 200, the top side of the second layer 420 terminates approximately flush with the top side 201 of the optoelectronic semiconductor chip-component 200. The cavity 160 of the package body 130 is not completely filled by the optoelectronic semiconductor chip-component 200 and the layers 410, 420 of the potting materials 310, 320.

FIG. 9 shows a schematic sectional side view of the arrangement from FIG. 8 in a processing state temporally succeeding the illustration in FIG. 8.

A wavelength-converting material 330 has been arranged over the second layer 420.

Arranging the wavelength-converting material 330 may have been effected by means of a metering method (dispensing), for example. The wavelength-converting material 330 is arranged over the second layer 420 and over the top side 201 of the optoelectronic semiconductor chip-component 200 and constitutes a third layer 430. In the example illustrated, the quantity of the wavelength-converting material 330 is dimensioned such that the empty space that still remained in the cavity 160 after introducing the first potting material 310 and the second potting material 320 is completely filled.

Arranging the wavelength-converting material 330 over the second layer 420 has been affected before the first potting material 310 of the second layer 420 has cured.

The wavelength-converting material 330 comprises a matrix material and wavelength-converting particles 335 embedded into the matrix material. The matrix material may be a silicone, for example. It is expedient if the matrix material of the wavelength-converting material 330 is similar or identical to the first potting material 310. The wavelength-converting particles 335 of the wavelength-converting material 330 are configured to convert electromagnetic radiation emitted by the optoelectronic semiconductor chip 210 of the optoelectronic semiconductor chip-component 200 at least partly into electromagnetic radiation of a different wavelength.

FIG. 10 shows the arrangement from FIG. 9 in a processing state temporally succeeding the illustration in FIG. 9.

The wavelength-converting particles 335 contained in the wavelength-converting material 330 have sunk by way of sedimentation. Some of the wavelength-converting particles 335 have sunk as far as the top side 201 of the optoelectronic semiconductor chip-component 200. Some of the wavelength-converting particles 335 have sunk right into the first potting material 310 of the second layer 420. Some of the wavelength-converting particles 335 may even have sunk into the second potting material 320 of the first layer 410. Substantially only the matrix material of the wavelength-converting material 330, which may correspond to the first potting material 310, has remained in the third layer 430 arranged over the second layer 420.

FIG. 11 shows, in a schematic sectional side view, a processing state corresponding to the illustration in FIG. 3 during the implementation of a further variant of the production method described above.

In this variant, the carrier 100 is again formed as a temporary carrier 110. An adhesive film 120 is again arranged at the top side 101 of the temporary carrier 100, 110. A plurality of optoelectronic semiconductor chip-components 200 are secured to the top side 101 of the carrier 100 by means of the adhesive film 120.

In addition, a package frame 150 is arranged at the top side 101 of the carrier 100 and fixed by the adhesive film 120. The package frame 150 may comprise for example a plastic material, for example an epoxy. The package frame 150 may have been produced beforehand by means of a molding method (mold method), for example.

The package frame 150 is formed as a grid comprising a regular arrangement of openings that constitute cavities 160. In the example illustrated, an optoelectronic semiconductor chip-component 200 is arranged in each cavity 160 of the package frame 150. Arranging the optoelectronic semiconductor chip-components 200 at the top side 101 of the carrier 100 may have been effected before or after arranging the package frame 150 at the top side 101 of the carrier 100.

In the example illustrated, the optoelectronic semiconductor chip-components 200 each comprise only one optoelectronic semiconductor chip 210, which may be formed as a sapphire flip-chip. However, the optoelectronic semiconductor chip-components 200 could also be formed differently.

After arranging the package frame 150 and the optoelectronic semiconductor chip-components 200, the first potting material 310 has been arranged over the top side 101 of the carrier 100. The second potting material 320 was then arranged over the first potting material 310. The first potting material 310 has at least partly wetted the side faces 203 of the optoelectronic semiconductor chip-components 200 and the package walls 170 of the package frame 150 delimiting the cavities 160, such that the second potting material 320 was no longer able to wet these surfaces.

Figure 12:
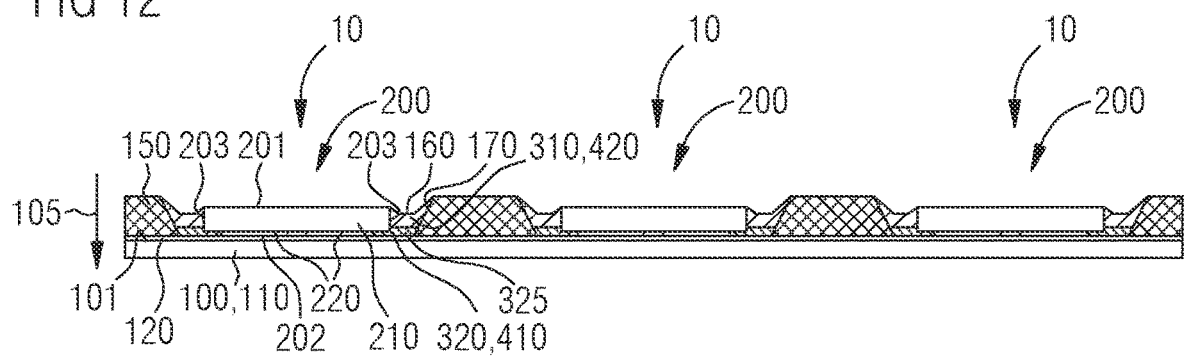
FIG. 12 shows the arrangement after centrifuging the carrier.

FIG. 12 shows a schematic sectional side view of the arrangement shown in FIG. 11 in a processing state temporally succeeding the illustration in FIG. 11. The carrier 100 has been centrifuged in such a way that the second potting material 320, which comprises a higher density than the first potting material 310, has migrated in a direction 105 toward the top side 101 of the carrier 100. Once again the first layer 410 arranged over the top side 101 of the carrier too and the second layer 420 arranged over the first layer 410 have formed as a result. The first layer 410 comprises the second potting material 320. The second layer 420 comprises the first potting material 310.

Figure 13:
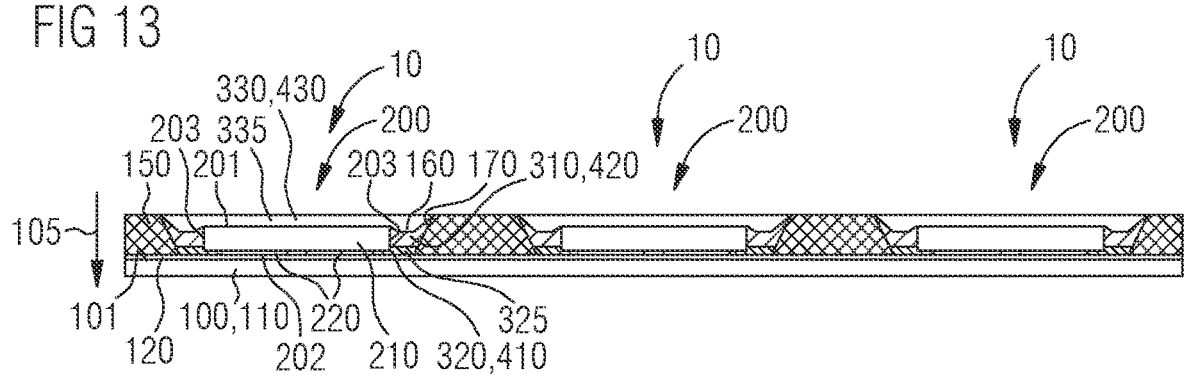
FIG. 13 shows the arrangement after arranging a wavelength-converting material.

FIG. 13 shows a schematic sectional side view of the arrangement illustrated in FIG. 12 in a processing state temporally succeeding the illustration in FIG. 12.

Wavelength-converting material 330 has been arranged over the second layer 420 and over the top sides 201 of the optoelectronic semiconductor chip-components 200. The wavelength-converting material 330 constitutes the third layer 430 and substantially completely fills the empty spaces that previously still remained in the cavities 160 of the package frame 150.

In contrast to the variant of the production method described with reference to FIGS. 7 to 10, the wavelength-converting material 330 has been arranged only after the curing of the second layer 420. This prevents the wavelength-converting particles 335 contained in the wavelength-converting material 330 from sedimenting in the second layer 420.

In a processing step temporally succeeding the illustration in FIG. 13, the temporary carrier 100, 110 and the adhesive film 120 are stripped away. In addition, the body constituted by the layers 410, 420, 430 and the package frame 150 is divided into a plurality of optoelectronic devices 10 such that each optoelectronic device 10 comprises one of the optoelectronic semiconductor chip-components 200. The dividing may be effected before or after stripping away the temporary carrier 110.

Figure 14:
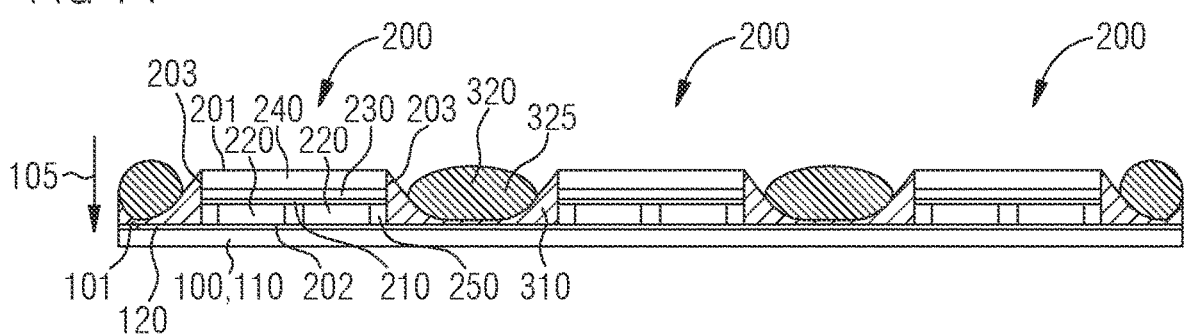
FIG. 14 shows a further arrangement comprising a carrier, optoelectronic semiconductor chip-components arranged over a top side of the carrier, a first potting material arranged over the top side of the carrier and a second potting material arranged over the first potting material.

FIG. 14 shows a schematic sectional side view of a processing state corresponding to the illustration in FIG. 3 during the implementation of a further variant of the production method.

In the variant shown in FIG. 14, too, the carrier 100 is formed as a temporary carrier 110. Once again an adhesive film 120 is arranged at the top side 101 of the carrier 100.

A plurality of optoelectronic semiconductor chip-components 200 have been arranged over the top side 101 of the carrier 100. In this exemplary variant of the production method, each optoelectronic semiconductor chip-component 200 comprises an optoelectronic semiconductor chip 210 formed for example as a surface emitting flip-chip. A converter layer 230 is arranged at the radiation emission surface of the optoelectronic semiconductor chip 210 and is provided for converting at least one portion of the electromagnetic radiation emitted by the optoelectronic semiconductor chip 210 into electromagnetic radiation of a different wavelength. A cover 240 is arranged over the converter layer 230. The cover 240 may be formed as a glass lamina, for example. A surface of the cover 240 facing away from the converter layer 230 constitutes the top side 201 of the optoelectronic semiconductor chip-component 200. In each optoelectronic semiconductor chip-component 200, the electrical contact pads 220 of the optoelectronic semiconductor chip 210 are embedded into a molded body 250 carrying the light emitting layer of the optoelectronic semiconductor chip 210. An underside of the molded body 250 facing away from the light emitting layer of the optoelectronic semiconductor chip 210 constitutes the underside 202 of the optoelectronic semiconductor chip-component 200.

At the underside 202 of the optoelectronic semiconductor chip-component 200, the electrical contact pads 220 are exposed.

After arranging the optoelectronic semiconductor chip-components 200 over the top side 101 of the temporary carrier 100, 110, the first potting material 310 has been arranged over the top side 101 of the carrier 100. In this case, the first potting material 310 has at least partly wetted the side faces 203 of the optoelectronic semiconductor chip-components 200. The second potting material 320 has subsequently been arranged over the first potting material 310.

Figure 15:
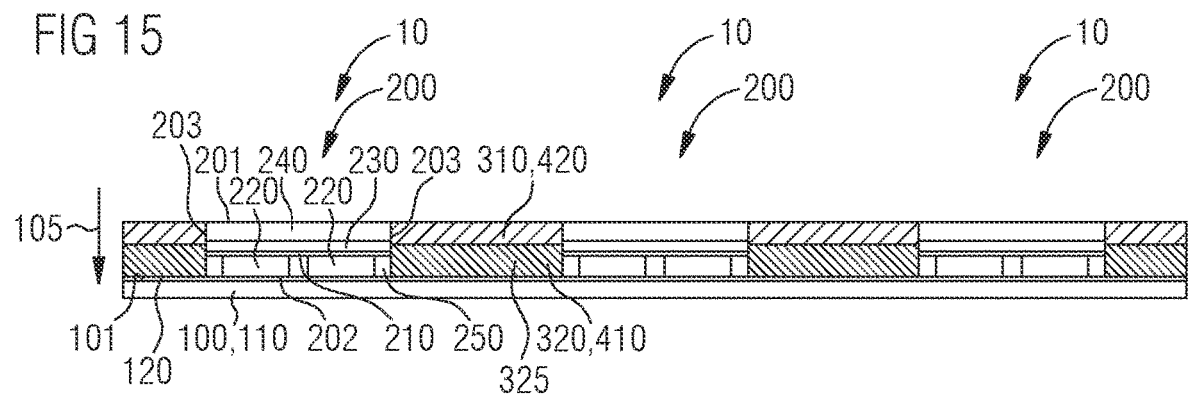
FIG. 15 shows the arrangement after centrifuging the carrier.

FIG. 15 shows a schematic sectional side view of the arrangement shown in FIG. 14 in a processing state temporally succeeding the illustration in FIG. 14.

The carrier 100 has been centrifuged in such a way that the second potting material 320 has migrated in a direction 105 toward the top side 101 of the carrier 100. As a result, once again the first layer 410 and the second layer 420 arranged over the first layer 410 have been formed over the top side 101 of the carrier 100. The first layer 410 comprises the second potting material 320. The second layer 420 comprises the first potting material 310. The interface between the planar first layer 410 and the planar second layer 420 is approximately at the level of the converter layers 230 of the optoelectronic semiconductor chip-components 200. The second layer 420 terminates approximately flush with the top sides 201 of the optoelectronic semiconductor chip-components 200.

The body constituted from the first layer 410 and the second layer 420 could then be detached from the temporary carrier 100, 110 and the adhesive film 120 and be divided in order to obtain a plurality of optoelectronic devices 10, each comprising an optoelectronic semiconductor chip-component 200. Before that, however, the processing step described below may also be carried out as well.

Figure 16:
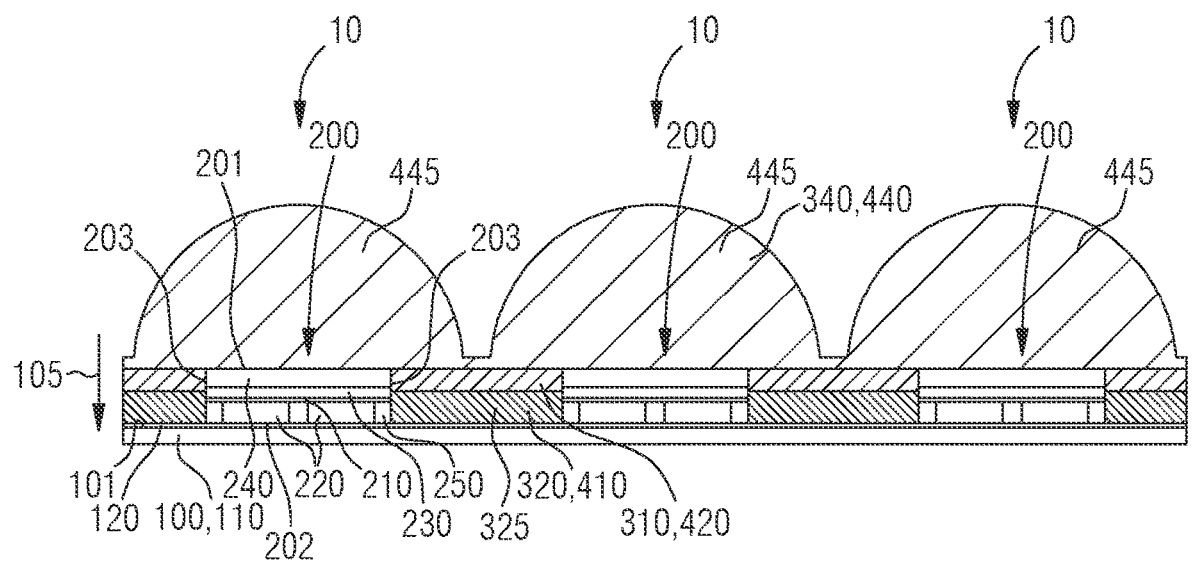
FIG. 16 shows the arrangement after applying a lens layer.

FIG. 16 shows a schematic sectional side view of the arrangement shown in FIG. 15 in a processing state temporarily succeeding the illustration in FIG. 15.

A lens layer 440 has been arranged over the second layer 420. The lens layer 440 comprises a lens material 340. The lens material 340 is transparent to electromagnetic radiation emitted by the optoelectronic semiconductor chip-components 200. The lens material 340 may comprise a silicone or an epoxy, for example. The lens layer 440 may have been applied by means of a molding method (mold method), for example.

In the example illustrated, the lens layer 440 constitutes a convex optical lens 445 over each optoelectronic semiconductor chip-component 200. These optical lenses 445 are configured to focus electromagnetic radiation emitted by the optoelectronic semiconductor chip-components 200. A different design of the optical lenses 445 is possible.

In processing steps succeeding the illustration in FIG. 16, the temporary carrier 100, no and the adhesive film 120 are stripped away. In addition, the body constituted by the first layer 410, the second layer 420 and the lens layer 440 is divided in such a way that each part constitutes an optoelectronic device 10 comprising an optoelectronic semiconductor chip-component 200 and an optical lens 445. The dividing may be effected before or after stripping away the temporary carrier 100, 110.

The invention has been illustrated and described in more specific detail on the basis of the preferred exemplary embodiments. Nevertheless, the invention is not restricted to the examples disclosed. Rather, other variations may be derived therefrom by the person skilled in the art, without departing from the scope of protection of the invention.

The invention claimed is:

1. A method for producing an optoelectronic device, the method comprising:
   providing a carrier with an optoelectronic semiconductor chip-component arranged on a top side of the carrier;
   arranging a first potting material on the top side of the carrier;
   arranging a second potting material on the first potting material,
   wherein the second potting material comprises a higher density than the first potting material,
   wherein a top side of the optoelectronic semiconductor chip-component is covered by neither the first potting material nor the second potting material; and
   allowing a force to act on the first potting material and the second potting material such that the second potting material migrates in a direction toward the top side of the carrier.

2. The method according to claim 1, wherein allowing the force to act comprises centrifuging the carrier.

3. The method according to claim 1, wherein the first potting material is arranged on the top side of the carrier in such a way that a side face of the optoelectronic semiconductor chip-component is wetted by the first potting material.

4. The method according to claim 1, wherein the second potting material is arranged before the first potting material has cured.

5. The method according to claim 1, wherein allowing the force to act is performed such that a first layer comprising the second potting material forms over the top side of the carrier, and a second layer comprising the first potting material forms over the first layer.

6. The method according to claim 5, further comprising arranging a wavelength-converting material over the second layer.

7. The method according to claim 6, wherein the wavelength-converting material is arranged before the second layer has cured.

8. The method according to claim 6, wherein the wavelength-converting material is arranged after the second layer has cured.

9. The method according to claim 6, wherein the wavelength-converting material comprises silicone with wavelength-converting particles embedded therein.

10. The method according to claim 1, wherein the first potting material comprises silicone.

11. The method according to claim 1, further comprising, after allowing the force to act, removing at least one part of the first potting material.

12. The method according to claim 11, wherein the first potting material comprises a solvent,
   and wherein the solvent is removed by evaporation.

13. The method according to claim 1, wherein the second potting material comprises silicone.

14. The method according to claim 1, wherein the second potting material comprises embedded particles.

15. The method according to claim 14, wherein the second potting material comprises between 30 percent by weight and 50 percent by weight, inclusive, of embedded $TiO_2$ particles comprising an average diameter of between 100 nm and 300 nm, inclusive.

16. The method according to claim 1, wherein the first potting material comprises a density of between 1 $g/cm^3$ and 1.3 $g/cm^3$, inclusive, and wherein the second potting material comprises a density of between 1.4 $g/cm^3$ and 2.2 $g/cm^3$, inclusive.

17. The method according to claim 1, wherein the optoelectronic semiconductor chip-component comprises an optoelectronic semiconductor chip.

18. The method according to claim 1, further comprising, after allowing the force to act, removing the carrier.